United States Patent
Gauvin et al.

(10) Patent No.: US 6,760,803 B1
(45) Date of Patent: Jul. 6, 2004

(54) ALIGNING AND OFFSETTING BUS SIGNALS

(75) Inventors: Jeffrey J. Gauvin, Colorado Springs, CO (US); Wiliam K. Petty, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 361 days.

(21) Appl. No.: 10/032,188

(22) Filed: Dec. 21, 2001

(51) Int. Cl.[7] ............................................. G06F 13/00
(52) U.S. Cl. ...................... 710/305; 713/401; 713/600
(58) Field of Search .............................. 710/1, 29, 52, 710/305; 713/400, 401, 500–503, 600; 327/261–265, 269–271, 276–279, 284

(56) References Cited

U.S. PATENT DOCUMENTS

| | | | | |
|---|---|---|---|---|
| 4,495,570 A | * | 1/1985 | Kitajima et al. | ............ 713/502 |
| 5,371,880 A | * | 12/1994 | Bhattacharya | ............... 713/400 |
| 5,644,787 A | * | 7/1997 | Nakamura et al. | ............ 710/52 |
| 5,832,308 A | * | 11/1998 | Nakamura et al. | ............ 710/52 |
| 6,255,878 B1 | * | 7/2001 | Gauvin et al. | ............... 327/263 |
| 6,256,695 B1 | * | 7/2001 | Williams | ..................... 710/107 |

* cited by examiner

Primary Examiner—Xuan M. Thai
(74) Attorney, Agent, or Firm—John R. Ley, LLC

(57) ABSTRACT

A bus interface and a receiver in the bus interface receive signals from a computer bus, such as a SCSI (Small Computer System Interface) bus, and deskew and synchronize the signals into valid data and control signals. The signals are aligned and then a portion of the signals is offset to ensure that the other signals have sufficient time to stabilize before being latched. The alignment is performed by adding and subtracting delay units to and from the signals. The offset is determined by a self-calibration logic that uses the same type of delay units.

16 Claims, 3 Drawing Sheets

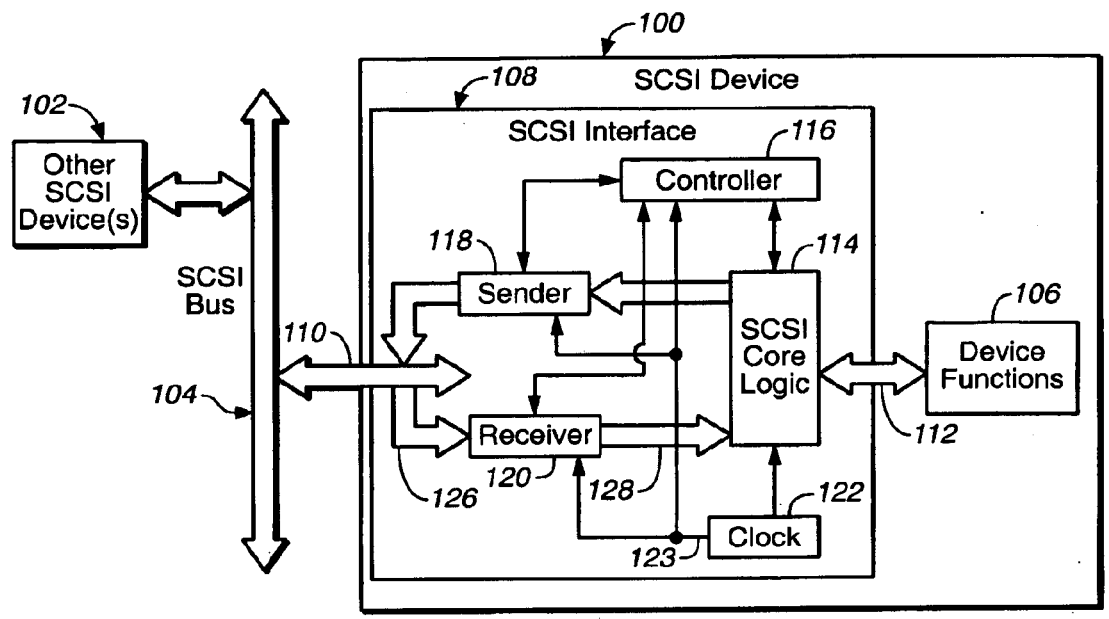
FIG._1
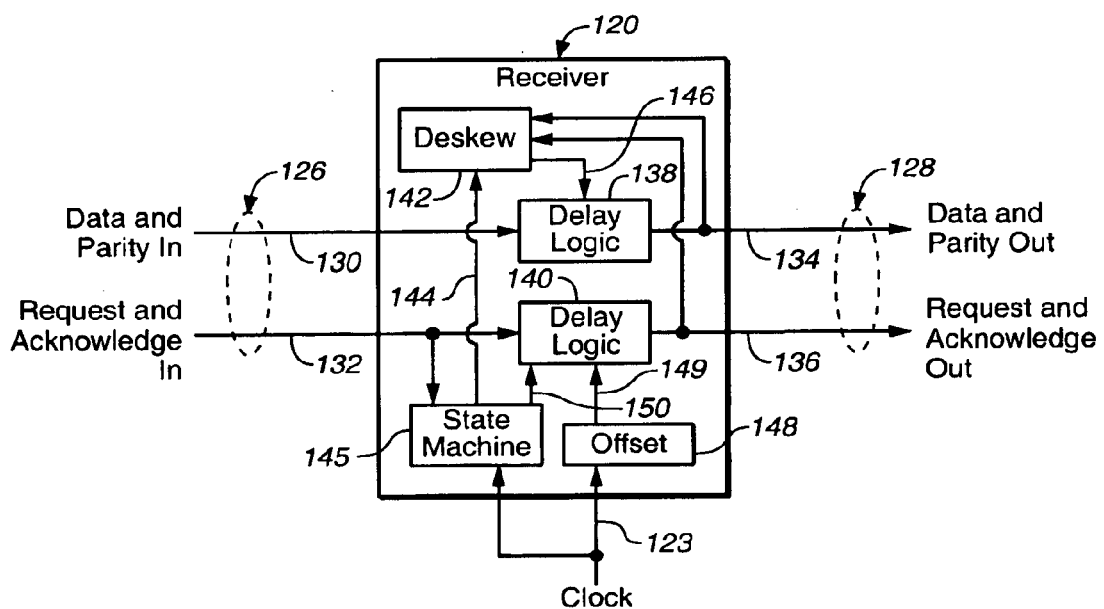
FIG._2

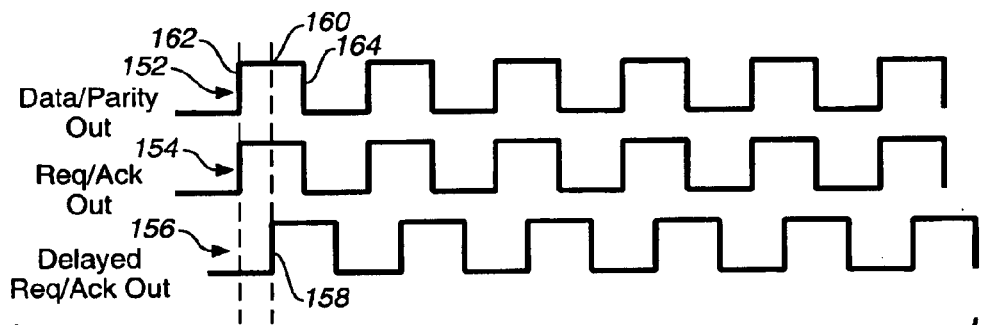
FIG._3
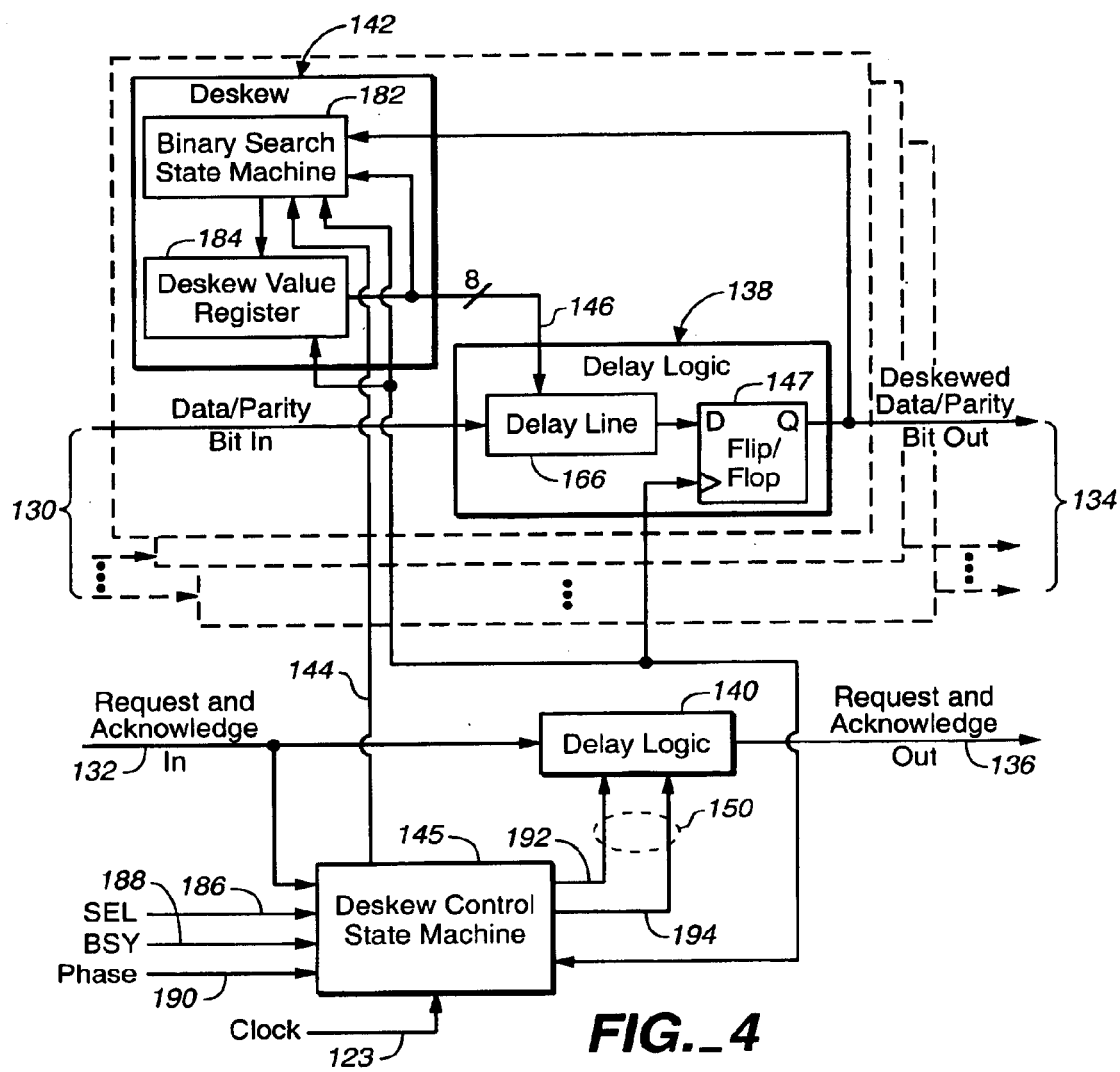
FIG._4

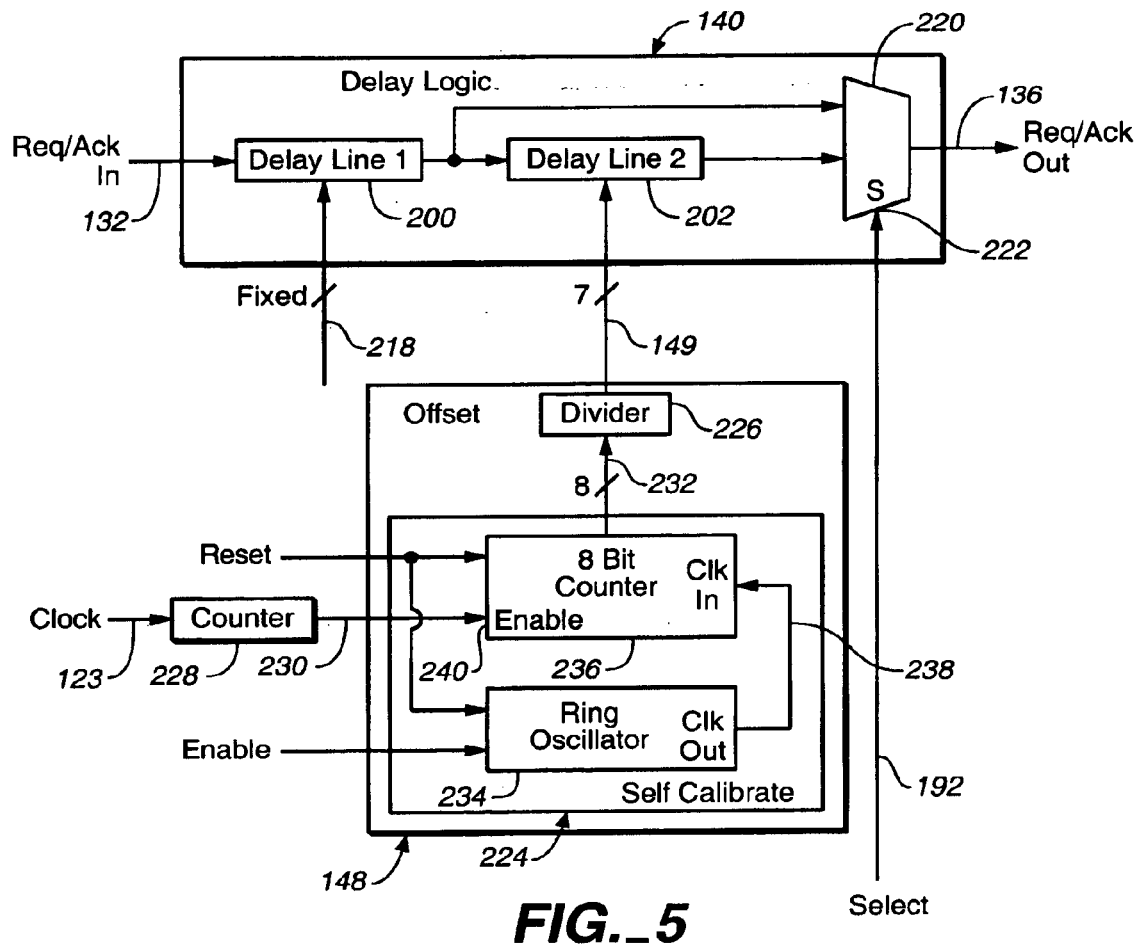
FIG._5
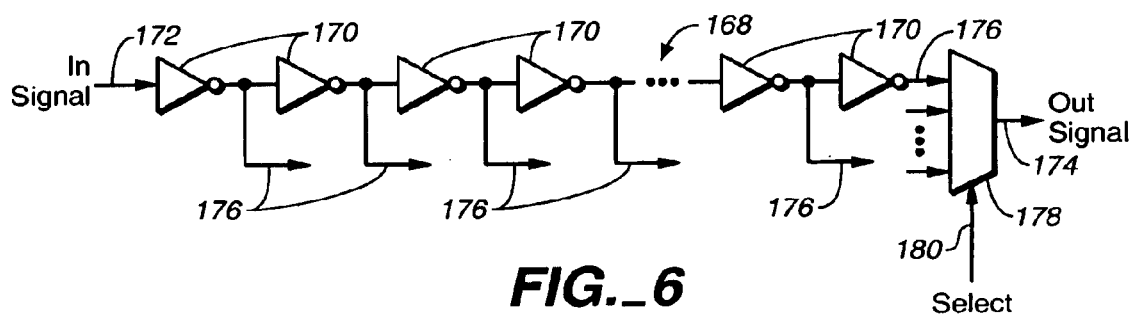
FIG._6

ALIGNING AND OFFSETTING BUS SIGNALS

FIELD

The subject matter herein relates to deskewing and offsetting electronic signals, such as multiple signals transmitted in parallel over a computer bus.

BACKGROUND

When multiple synchronized signals are transferred from one device to another across a bus system (i.e. parallel bus signals), the signals may lose their synchronization, or become "skewed." It is, therefore, necessary to "deskew" and "resynchronize" the signals. It is also often necessary to offset the signals by a desired amount for certain timing requirements of the circuitry. A variety of deskew, synchronization, alignment and offset techniques have been developed for a variety of applications or situations. General requirements for such techniques are that they be relatively fast, error-free, easy to design and simple to implement or manufacture in an integrated circuit (IC) chip.

It is with respect to these and other background considerations that the subject matter herein has evolved.

SUMMARY

The subject matter described herein involves a bus interface and a receiver in the bus interface that receives signals from a computer bus and deskews and synchronizes the signals into valid data and control signals for use by the bus interface or a bus device of which the bus interface is a component. In a particular embodiment, the computer bus is a SCSI (Small Computer System Interface) bus, the standards for which specify a number of data and parity signals (e.g. 18 data/parity signals) and "request" and "acknowledge" signals that must be synchronized upon receipt in order to establish valid useable signals for transferring information. In a SCSI environment, the data and parity signals are typically latched on the edges of the request or acknowledge signal. Therefore, according to the subject matter herein, the data and parity signals are initially synchronized to the request or acknowledge signal and then the request or acknowledge signal is offset to ensure that the data and parity signals have sufficient time to stabilize before being latched on the edges of the request or acknowledge signal.

Generally, the signals are fed through delay logic, which adds or subtracts delay to or from each signal to synchronize the signals. In a particular embodiment the delay logic includes a series of delay units (buffers or inverters) through which the signals are passed. "Taps" are located before or after each of the delay buffers at which the signals may be read with different amounts of delay.

Thus, by reading the signal at different taps, delay may be added to or subtracted from the signal.

In a particular embodiment, the amount of the offset for the request or acknowledge signal is determined by offset logic that uses the same type of circuitry used in the delay logic, e.g. the delay buffers or inverters. The performance of the delay buffers, i.e. the period of the delay, is dependent on temperature, voltage and other conventional characteristics, parameters or environmental conditions of an IC incorporating the bus interface and the delay logic. Thus, the delay period, or performance characteristic, for one delay buffer in the offset logic is about the same as for one delay buffer in the delay logic.

The delay buffers for the offset logic are arranged in a conventional ring oscillator, which thus produces a signal having a period dependent on the performance characteristics of the delay buffers. The ring oscillator signal is used to clock a counter for a known period of time. The counter thus produces a total count at the end of the known period of time that is directly related to the performance characteristics of the delay buffers in both the offset logic and the delay logic. The known period of time and the number of delay buffers in the offset logic are selected so that the resulting count of the counter is directly related (e.g. by an integer multiple) to the number of delay periods (one per delay buffer) that need to be added to the request or acknowledge signal to offset the request or acknowledge signal sufficiently to ensure that the data and parity signals have time to stabilize before being latched on the edges of the request or acknowledge signal.

For example, in a current version of the SCSI standards, the request and acknowledge signals generally have 6¼ nanoseconds between rising and falling edges. Thus, after the data and parity signals have been synchronized to the request or acknowledge signal, the delay added to the request or acknowledge signal may be about one-half of the time between the rising and falling edges (e.g. 3⅛ nanoseconds), so the data and parity signals have about this much time to stabilize before being latched.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWINGS

FIG. 1 is a block diagram of a SCSI (Small Computer System Interface) device connected to other SCSI devices through a SCSI bus.

FIG. 2 is a block diagram of a receiver within a SCSI interface incorporated in the SCSI device shown in FIG. 1.

FIG. 3 is a timing diagram of signals handled by the receiver shown in FIG. 2.

FIG. 4 is a block diagram of deskew logic incorporated in the receiver shown in FIG. 2.

FIG. 5 is a block diagram of offset logic and delay logic incorporated in the receiver shown in FIG. 2.

FIG. 6 is a block diagram of a series of delay buffers incorporated in the receiver shown in FIG. 2.

DETAILED DESCRIPTION

A SCSI (Small Computer System Interface) device 100 generally connects to other SCSI devices 102 through a conventional SCSI bus 104 as shown in FIG. 1. The SCSI device 100 performs various conventional functions (e.g. storage access, network access, etc.) through device function circuitry 106, which communicates with the SCSI bus 104 through a SCSI interface 108. The SCSI interface 108, therefore, passes signals 110 and 112 back and forth between the SCSI bus 104 and the device function circuitry 106, respectively.

To handle the signal transmissions, the SCSI interface 108 generally includes SCSI core logic 114, a conventional controller 116, conventional sender logic 118 and receiver logic 120. The SCSI core logic 114 performs the primary conventional functions of the SCSI interface 108 for transferring information on the SCSI bus 104 according to SCSI standards. The sender logic 118 and the receiver logic 120 form a physical interface between the SCSI bus 104 and the SCSI core logic 114 to physically send and receive the signals 110 externally to the SCSI device 100. The SCSI core logic 114, the sender logic 118 and the receiver logic 120 operate according to instructions from the controller 116 (e.g. a microprocessor), which typically operates under firmware (not shown). Additionally, a conventional precision external clock source 122, such as a crystal oscillator, supplies a conventional precision clock signal 123 to the SCSI core logic 114, the controller 116, the sender logic 118 and the receiver logic 120.

The signals that are transmitted across the SCSI bus 104 include multiple parallel bus signals that must be synchronized together in order to form valid data, address and control information. However, upon arriving at the receiver logic 120 from one of the other SCSI devices 102, incoming signals 126 are typically skewed from one another, so they may not represent valid information in this form. Therefore, the receiver logic 120 must deskew the incoming signals 126 in order to supply valid signals 128 to the SCSI core logic 114.

The incoming signals 126 typically include, among other signals, data and parity IN (data/parity IN) signals 130 and request and acknowledge IN (req/ack IN) signals 132, as shown in FIG. 2. The valid signals 128 typically include, therefore, data/parity OUT signals 134 and req/ack OUT signals 136. The data/parity IN signals 130 and the req/ack IN signals 132 pass through delay logic 138 and 140, respectively, in the receiver logic 120 to produce the data/parity OUT signals 134 and the req/ack OUT signals 136, respectively.

The delay logic 138 and 140 initially delay the IN signals 130 and 132 by approximately the same amount. The OUT signals 134 and 136 are supplied to a deskew logic 142. The deskew logic 142, according to a control signal 144 from a deskew control state machine 145, under control of the controller 116 (FIG. 1), determines the relative skew between the OUT signals 134 and 136 and produces a deskew signal 146 instructing the delay logic 138 to add additional delay to or subtract previously added delay from the data/parity IN signal 130 to bring the data/parity OUT signal 134 into closer alignment with the req/ack OUT signal 136.

After the deskewing, the OUT signals 134 and 136 are closely aligned. However, it is the edges of the req/ack OUT signal 136 at which the data/parity OUT signals 134 are latched by latches 147 (FIG. 4) described below. Therefore, rather than being exactly aligned, the OUT signals 134 and 136 must be offset from each other by an appropriate amount, so that the data/parity OUT signals 134 have time to stabilize before being latched.

To ensure a proper offset between the out signals 134 and 136, an offset logic 148 receives the precision clock signal 123 from the clock source 122 (FIG. 1) and determines therefrom an appropriate amount of delay to be added to the req/ack IN signal 132. For example, in current SCSI standards, there are approximately 6¼ nanoseconds between edges of the req/ack OUT signals 136, so an appropriate offset may be about 3⅛ nanoseconds, or one-half of the time between the edges of the req/ack OUT signals 136. The offset logic 148 thus supplies an offset signal 149 to the delay logic 140 indicating the amount of delay to be added to the req/ack IN signal 132 for the proper offset. After the deskew logic 142 has completed the deskewing of the OUT signals 134 and 136, another control signal 150 from the deskew control state machine 145 instructs the delay logic 140 to add the indicated amount of the delay to the req/ack IN signal 132.

Timing diagrams 152, 154 and 156, as shown in FIG. 3, illustrate the offset between the OUT signals 134 and 136 (FIG. 2). After the deskewing, the data/parity OUT signal 134 is substantially aligned with the req/ack OUT signal 136, as shown by the timing diagrams 152 and 154. After the req/ack OUT signal 136 is delayed, the edge 158 of the delayed req/ack OUT signal 136 occurs at about the midpoint 160 of two edges 162 and 164 of the data/parity OUT signal 134, as shown by the timing diagrams 152 and 156. Therefore the data/parity OUT signals 134 have until their midpoint 160 to stabilize before being latched.

The components of the deskew logic 142 and the delay logic 138 are shown in FIG. 4. There are preferably one set of the deskew logic 142 and the delay logic 138 for each bit of the data/parity IN and OUT signals 130 and 134. The delay logic 138 preferably includes a delay line 166 and the latch 147.

A structure for an "exemplary" delay line 168 is shown in FIG. 6. The delay line 166 (FIG. 4) is generally similar to the one shown for the exemplary delay line 168. The exemplary delay line 168 includes a series of conventional delay units, buffers or inverters, 170 through which an IN signal 172 (e.g. data/parity IN 130 or req/ack IN 132, FIGS. 2, 4 and 5) is passed to generate an OUT signal 174 (e.g. data/parity OUT 134 or req/ack OUT 136, FIGS. 2, 4 and 5). Each delay unit 170 adds an incremental amount of delay to the IN signal 172. A series of taps 176 connect to the outputs of each of the delay units 170, including the last delay unit 170. The taps 176 are fed into a multiplexer 178, and one of the taps 176 is selected as the OUT signal 174. A select signal 180 (e.g. the deskew signal 146 or the offset signal 149, FIGS. 2, 4 and 5) fed into the multiplexer 178 selects the desired tap 176.

Returning to FIG. 4, the delay line 166 receives one of the "data/parity bits IN" of the data/parity IN signals 130, adds delay to this signal according to the deskew signal 146 and supplies the delayed signal to the latch 147. The latch 147 may include a conventional "D" flip-flop, as shown, which receives the output of the delay line 166 at its "D" input and supplies the output of the delay line 166 at its "Q" output as one "deskewed data bit out" of the data/parity OUT signals 134. The latch 147 is clocked by the req/ack OUT signal 136.

The deskew logic 142 generally includes a binary search state machine 182 and a deskew value register 184. The deskew value register 184 preferably includes a conventional register, clocked by the req/ack OUT signal 136, that stores an 8-bit value for the deskew signal 146, which is supplied to the delay line 166. The 8-bit value indicates the number of delay units 170 (FIG. 6) that the delay line 166 is to add to the "data/parity bit IN" signal.

The binary search state machine 182 preferably includes conventional state machine components (not shown) for performing a conventional binary search. In a binary search, each bit of a binary value (in this case, the 8-bit deskew signal 146) is determined in sequence preferably from the most significant bit to the least significant bit.

The binary search begins by the binary search state machine 182 setting only the most significant bit in the deskew signal 146, so the deskew signal 146 has an initial value of 80 hex. The 80 hex value of the deskew signal 146 causes the delay line 166 to add one-half of the total delay units 170 (FIG. 6) to the "data/parity bit IN" signal. Thus, the initial delay is added to the "data/parity bit IN" signal to form an initial "deskewed data/parity bit OUT" signal. Additionally, an initial delay (described below) is added to the req/ack IN signal 132 to form an initial req/ack OUT signal 136. The binary search state machine 182 receives and compares the initial "deskewed data/parity bit OUT" signal and the initial req/ack OUT signal 136 to determine which it received first. If the req/ack OUT signal 136 is received first, then the most significant bit is maintained in the deskew value register 184. On the other hand, if the "deskewed data/parity bit OUT" signal is received first, then the most significant bit is cleared in the deskew value register 184. In either case, the binary search state machine 182 then sets of the next most significant bit and repeats the comparison and determines whether to maintain or clear the next most significant bit. The binary search state machine 182 continues with each bit of the deskew value register 184 until each bit has been resolved. In this manner, each "deskewed data/parity bit OUT" signal of the data/parity OUT signal 134 is individually aligned with the req/ack OUT signal 136 in parallel.

The deskew control state machine 145 includes conventional state machine components (not shown) to generate control signals for controlling the functions of the deskew logic 142 and the delay logic 138 and 140. The deskew control state machine 145 is clocked by the precision clock signal 123 and receives the req/ack OUT signal 136 for calculating when the deskew procedure is over. The deskew control state machine 145 also receives the req/ack IN signal 132 and other conventional SCSI bus signals, such as a SEL (select) signal 186, a BSY (busy) signal 188 and a phase signal 190, which indicate the start of a SCSI bus communication at which the deskew procedure needs to be performed.

Upon receiving a proper combination of the signals 132, 186, 188 and 190 indicating the start of a SCSI bus communication and the need to perform the deskew procedure, the deskew control state machine 145 sends the control signal 150, comprising two select signals 192 and 194, to the delay logic 140. One select signal 192 causes the delay logic 140 to select an initial delay for the req/ack OUT signal 136, described below, and comparable to the initial delay of the "data/parity bit IN" signal described above. Upon completion of the deskewing, the select signal 192 switches to cause the delay logic 140 to offset the delay of the req/ack OUT signal 136 as described below. The other select signal 194 causes the delay logic 140 to select between the "request" and the "acknowledge" signals, as indicated by the req/ack IN signal 132, to supply as the req/ack OUT signal 136. Also upon receiving the indication of the need to perform the deskew procedure, the deskew control state machine 145 sends the control signal 144 to the binary search state machine 182 causing the binary search state machine 182 to start the binary search described above. The control signal 144 is deasserted at completion of the deskewing.

The components of the delay logic 140 and the offset logic 148 are shown in FIG. 5. The delay logic 140 preferably includes two delay lines 200 and 202, similar to the delay line 166 (FIG. 4) and the exemplary delay line 168 (FIG. 6), except that the delay lines 200 and 202 are each approximately half of the delay line 166.

The first delay line 200 adds the initial delay to the req/ack IN signal 132 according to a fixed signal 218 (e.g. the select signal 180, FIG. 6) to generate the initial req/ack OUT signal 136 to which the data/parity OUT signals 134 (FIGS. 2 and 4) are aligned by the deskew logic 142 (FIGS. 2 and 4). The fixed signal 218 may thus be any appropriate binary number (e.g. all 1's) that will add the desired initial amount of delay to the req/ack IN signal 132. For example, if the fixed signal 218 is all 1's, the first delay line 200 will add the maximum delay (i.e. the output of the last delay unit 170 is selected).

The second delay line 202 adds additional delay to the output of the first delay line 202 according to the offset signal 149 supplied by the offset logic 148 to appropriately offset the req/ack OUT signal 136 after the OUT signals 134 and 136 (FIG. 2) have been aligned. In other words, after the offset logic 148 determines the offset signal 149, the offset signal 149 is supplied as the select signal 180 (FIG. 6) to the multiplexer 178 (FIG. 6) of the second delay line 202 to select the appropriate tap 176 (FIG. 6) that has the needed amount of delay for the OUT signal 174 (FIG. 6) of the second delay line 202, i.e. the delayed req/ack OUT signal 136.

The outputs of the delay lines 200 and 202 are fed through a multiplexer 220, which supplies the req/ack OUT signal 136. The select signal 192 from the deskew control state machine 145 (FIG. 4) is fed to a select input (S) 222 of the multiplexer 220 to cause the multiplexer 220 to select between the outputs of the two delay lines 200 and 202. Thus, the select signal 192 initially causes the multiplexer 220 to select the output of the first delay line 200 during the deskewing of the OUT signals 134 (FIG. 2) and 136 and then to select the output of the second delay line 202 when it is time to offset the req/ack OUT signal 136.

The offset logic 148 preferably includes a self calibration logic 224 and a conventional divider 226. The clock signal 123 is supplied to a counter 228, which sends a count enable signal 230 for a specified period of time to the self calibration logic 224. The period of time is related to the amount of offset which the second delay line 202 will add to the req/ack OUT signal 136. Thus, the self calibration logic 224 uses the count enable signal 230 to generate a count value signal 232, which is related to the amount of the offset, or the tap 176 (FIG. 6) for the number of delay units 170 (FIG. 6) which the second delay line 202 will add to the req/ack OUT signal 136. The divider 226 receives the count value signal 232 and divides the count value signal 232 by a predetermined number to form the offset signal 149, i.e. the select signal 180 (FIG. 6) for the second delay line 202. The offset signal 149 is thus a binary number which selects the needed tap 176 (FIG. 6) of the second delay line 202.

The self calibration logic 224 preferably includes a ring oscillator 234 and a conventional counter 236, such as an 8-bit counter. The ring oscillator 234 generates a clock signal 238 and supplies the clock signal 238 to the counter 236. The counter 236 counts the periods of the clock signal 238 during the specified time period, i.e. as long as the other counter 228 supplies the count enable signal 230 to an enable input 240 of the counter 236. At the end of the specified time period, the total count of the counter 236 (e.g. an 8-bit binary number) is supplied as the count value signal 232 to the divider 226. The divider 226 thus divides the total count by a predetermined number to generate the offset signal 149.

The ring oscillator 234 generates the clock signal 238 using the same type of conventional components (e.g. the delay units 170, FIG. 6) that generate the delay in the delay lines 166 (FIG. 4), 200 and 202. Therefore, any conditions or parameters (e.g. temperature, operating voltage, fabrication processes, etc.) that affect the function (e.g. the amount of delay) of each delay unit 170 of the delay lines 166, 200 and 202 will also affect the period of the clock signal 238 output by the ring oscillator 234. In other words, as the operating conditions and parameters cause the delay units 170 within the delay lines 166, 200 and 202 to operate faster or slower, the delay units 170 within the ring oscillator 234 cause the clock signal 238 to become proportionately faster or slower, respectively. Likewise, the total count (i.e. the count value signal 232) of the counter 236 and the value of the offset signal 149 become higher or lower, respectively. In this manner, the receiver logic 120 (FIGS. 1 and 2) is self-calibrating, since the number of the delay units 170 within the second delay line 202 needed to produce approximately the same offset for the req/ack OUT signal 136 under any conditions or subject to any parameters that affect the function of the delay units 170 is automatically determined by the offset logic 148.

For the circuitry described, the specified time period divided by the number of delay units 170 through which a signal in the ring oscillator 234 passes (during one period of the clock signal 238) is a multiple of the desired offset time. Additionally, the total count (the count value signal 232) is related by the same multiple to the number of delay units 170 (the offset signal 149) that must be added to the req/ack OUT signal 136 to achieve the desired offset. Therefore, the specified time period and the number of the delay units 170 in the ring oscillator 234 are preferably selected so that the multiple is an integer. In this case, the predetermined number by which the divider 226 divides the total count is selected to be the same integer multiple.

For example, for a desired offset of 3⅛ nanoseconds, as discussed above for current SCSI standards, a specified time period of 1200 nanoseconds and a ring oscillator 234 having 48 delay units 170 will result in an integer multiple of four for the predetermined number. A signal in the ring oscillator 234 must pass through the 48 delay units 170 twice for a complete cycle or period. Thus, the specified time period of 1200 nanoseconds divided by 2×48 delay units 170 is 12.5 nanoseconds, which is four (the integer multiple) times the desired 3⅛ nanosecond offset time. Therefore, dividing the total count (the count value signal 232) by four in the divider 226 results in the offset signal 149 being the needed number of delay units 170 to produce the desired offset in the second delay line 202. Other values for each of the parameters in this example may be used in other situations, depending on the requirements of the design.

The subject matter described above has the advantages of being easy to design and simple to implement or manufacture in an integrated circuit (IC) chip because all of the components are standard digital elements commonly formed in IC chips. Thus, the same design and fabrication procedures used to design and form the rest of the IC chip may be used to form the subject matter herein. Additionally, because the components and fabrication procedures are standard, there is less likelihood that errors will appear in either the fabrication or operation of the subject matter.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A method for aligning electrical signals relative to each other comprising:

receiving a plurality of first electrical signals and at least one second electrical signal;

adding delay units to the first and second electrical signals;

synchronizing the first electrical signals to the second electrical signal by adding additional delay units to or removing a portion of the previously added delay units from each of the first electrical signals until an edge of each of the first electrical signals is substantially aligned with an edge of the second electrical signal;

determining an offset for the second electrical signal in an integer multiple of the delay units by counting for a predetermined period of time and triggering each count with a periodic signal generated by a set of the delay units, a total count of the counting during the predetermined period of time being related to the integer multiple; and offsetting the second electrical signal relative to the first electrical signals by adding the integer multiple of the delay units to the second electrical signal.

2. A method as defined in claim 1, wherein the second signal has a period, and a speed of the delay units added to the first and second electrical signals and the delay units in the set that generates the periodic signal is affected by parameters including at least one of temperature, voltage and semiconductor fabrication procedures, further comprising:

generating the periodic signal at a rate dependent on the parameters that affect the speed of the delay unit; and offsetting the second signal by an amount related to the period of the second signal.

3. A method as defined in claim 1 further comprising:

determining the integer multiple by dividing the total count by a predetermined number.

4. A method as defined in claim 3 wherein:

the predetermined period of time is about 1200 nanoseconds;

the set of the delay units includes about 48 of the delay units;

the total count represents about 12.5 nanoseconds;

the predetermined number is about 4; and the offset is about 3⅛ nanoseconds.

5. A method as defined in claim 1, wherein the first and second electrical signals include parallel bus signals, further comprising:

receiving the first and second electrical signals in parallel;

adding delay units to the first and second electrical signals in parallel; and synchronizing the first electrical signals to the second electrical signal in parallel.

6. A method as defined in claim 5, wherein the first electrical signals include data signals and the second electrical signal includes one of a request signal and an acknowledge signal.

7. A method as defined in claim 5, wherein the parallel bus signals include SCSI (Small Computer System Interface) bus signals.

8. A computer interface receiver for receiving transmitted electrical signals and producing valid electrical signals therefrom for use by a computer interface, the transmitted electrical signals including first electrical signals and at least one second electrical signal, comprising:

first delay logic having a first set of a plurality of delay units receiving the first electrical signals and adding delay to the first electrical signals by passing the first electrical signals through a first predetermined number of the delay units in the first set;

second delay logic having a second set of a plurality of the delay units receiving the second electrical signal and adding delay to the second electrical signal by passing the second electrical signal through a second predetermined number of the delay units in the second set;

deskew logic connected to the first delay logic and receiving the first and second electrical signals to determine a skew between the first electrical signals and the second electrical signal and to signal the first delay logic to add and subtract delay units to and from the first predetermined number of the delay units until the first electrical signals are substantially aligned with the second electrical signal; and offset logic connected to the second delay logic and receiving a timing signal indicating a predetermined time period and generating an integer multiple of the delay units and supplying the integer multiple to the second delay logic to signal the second delay logic to add delay units to the second predetermined number of the delay units to offset the second electrical signal from the first electrical signals by a predetermined offset amount.

9. A computer interface receiver as defined in claim 8 wherein:

the offset logic has a third set of a plurality of the delay units and a counter;

the third set of the delay units generates a periodic signal and connects to the counter to supply the periodic signal to the counter;

the counter receives the timing signal and counts at a rate of the periodic signal for the predetermined time period to generate a total count related to the integer multiple; and the offset logic generates the integer multiple from the total count.

10. A computer interface receiver as defined in claim 9 wherein:

the offset logic has a divider; and the divider generates the integer multiple from the total count by dividing the total count by a predetermined number.

11. A computer interface receiver as defined in claim 10 wherein:

the predetermined period of time is about 1200 nanoseconds;

the set of the delay units includes about 48 of the delay units;

the total count represents about 12.5 nanoseconds;

the predetermined number is about 4; and the offset amount is about $3\frac{1}{8}$ nanoseconds.

12. A computer interface receiver as defined in claim 8 wherein:

the first delay logic has a plurality of the first set of delay units, one per each first electrical signal, each first set of delay units receiving one of the first electrical signals;

the first and second electrical signals include parallel bus signals;

the first sets of delay units receive the first electrical signals in parallel;

the second set of delay units receives the second electrical signal in parallel with the first electrical signals;

the first and second sets of delay units add delay to the first and second electrical signals in parallel; and the deskew logic aligns the first electrical signals to the second electrical signal in parallel.

13. A computer interface receiver as defined in claim 12, wherein the first electrical signals include data signals and the second electrical signal includes one of a request signal and an acknowledge signal.

14. A computer interface receiver as defined in claim 12, wherein the parallel bus signals include SCSI (Small Computer System Interface) bus signals.

15. A computer interface for receiving and sending information and electrical signals comprising:

means for receiving a plurality of first electrical signals and at least one second electrical signal;

a plurality of means for delaying electrical signals;

means for adding a first predetermined number of the delaying means to and subtracting previously added delaying means from the first electrical signals;

means for adding a second predetermined number of the delaying means to the second electrical signal;

means for determining a skew between the first electrical signals and the second electrical signal and for instructing the means for adding and subtracting the delaying means to and from the first electrical signals to add and subtract the delaying means to and from each first electrical signal as needed until each first electrical signal is substantially aligned with the second electrical signal; and means for offsetting the second electrical signal from the first electrical signals by a predetermined offset amount related to an integer multiple of the delaying means by producing a periodic signal generated by a third predetermined number of the delaying means, counting according to the periodic signal to a total count for a predetermined period of time, generating the integer multiple of the delaying means from the total count, and instructing the means for adding the delaying means to the second electrical signal to add the integer multiple of the delaying means to the second electrical signal.

16. A computer interface as defined in claim 15 wherein:

the offsetting means further includes an oscillator means, a counter means and a divider means;

the oscillator means includes a ring of the delaying means, each delaying means triggering a subsequent delaying means in the ring, one of the delaying means supplying the periodic signal, the delaying means of the oscillator means having performance parameters in common with the delaying means of the adding means causing the periodic signal to have a period dependent on the performance parameters common to the delaying means of the oscillator means and the adding means;

the counter means receives a timing signal for the predetermined period of time and the periodic signal and counts each period of the periodic signal to the total count, which total count depends on the performance parameters common to the delaying means of the oscillator means and the adding means; and the divider means receives the total count, divides the total count by a predetermined number to generate the integer multiple and supplies the integer multiple to the means for adding the delaying means to the second electrical signal to cause the means for adding the delaying means to the second electrical signal to add the integer multiple of the delaying means to the second electrical signal.

* * * * *